United States Patent [19]

Mori et al.

[11] Patent Number: 5,326,490
[45] Date of Patent: Jul. 5, 1994

[54] SURFACE TENSION SULFURIC ACID COMPOSITION

[75] Inventors: Kiyoto Mori, Soka; Takao Shihoya, Tokyo; Hisao Hara, deceased, late of Toyama, all of Japan, by Misako Hara and Eriko Hara, legal heirs

[73] Assignees: Kanto Kagaku Kabushiki Kaisha; Nissan Chemical Industries, Ltd., both of Tokyo, Japan

[21] Appl. No.: 602,223
[22] PCT Filed: Mar. 15, 1990
[86] PCT No.: PCT/JP90/00345
  § 371 Date: Nov. 15, 1991
  § 102(e) Date: Nov. 15, 1991
[87] PCT Pub. No.: WO90/10730
  PCT Pub. Date: Sep. 20, 1990

[30] Foreign Application Priority Data

Mar. 15, 1989 [JP] Japan .................................. 1-60765

[51] Int. Cl.$^5$ ...................... C09K 13/04; C09K 13/08; H01L 21/00; H01L 21/02
[52] U.S. Cl. .................................. 252/79.2; 252/79.3
[58] Field of Search .............................. 252/79.2, 79.3

[56] References Cited
FOREIGN PATENT DOCUMENTS

| 62-109985 | of 1987 | Japan . |
| 62-109985 | 5/1987 | Japan . |
| 63-45461 | of 1988 | Japan . |
| 0276774 | 8/1988 | Japan . |

Primary Examiner—Brian E. Hearn
Assistant Examiner—B. Everhart
Attorney, Agent, or Firm—Birch, Stewart, Kolasch & Birch

[57] ABSTRACT

Sulfuric acid or sulfuric acid/hydrogen peroxide cleaning solutions used in semiconductor manufacturing processes are improved in wettability and cleaning effect by lowering their surface tension through the addition of surface-active agents Of the general formula $R^1SO_2NR^2C_2H_4OA(I)$ wherein $R^1$ stands for a fluoroalkyl group, $R^2$ for H or a lower alkyl group and A for H or $SO_3H$.

5 Claims, No Drawings

SURFACE TENSION SULFURIC ACID COMPOSITION

TECHNICAL FIELD

This invention relates to a low surface tension sulfuric acid composition adapted for use in semiconductor manufacturing processes. More particularly, this invention relates to a low surface tension sulfuric acid composition containing specific fluoroalkylsulfonamides.

BACKGROUND ART AND PROBLEMS ASSOCIATED THEREWITH

In semiconductor manufacturing processes, sulfuric acid is used, either alone or in combination with other substances, for different purposes, for example, for cleaning silicon substrates, removing resist films or formulating etching solutions.

The increased density of integrated circuits nowadays has inevitably led to micronization of patterns and complication of the (trench structure (i.e. fine deep grooves). Use of conventional sulfuric acid under these condition gives rise to inconveniences such as difficult permeation into trenches and insufficient cleaning, due to high surface tension and poor wettability. Accordingly it is now strongly desired to develop a sulfuric acid composition with low surface tension and good wettability.

Although use of surface-active agent is expected to lower the surface tension of sulfuric acid, only very limited types of surface-active agent are stable in hot sulfuric acid, in particular, in highly oxidizing sulfuric acid/hydrogen peroxide liquid mixtures, with the result that it is in fact extremely difficult to find such surfaceactive agents that can be put into practical use.

As a result of research on a variety of surfaceactive agents, the inventors have found that specific ones amongst many fluorine-type surface-active agents are stable in hot liquid mixtures of sulfuric acid and hydrogen peroxide and capable of lowering the surface tension. The present invention bases itself on these findings.

DISCLOSURE OF THE INVENTION

The object of the present invention is to provide a sulfuric acid composition which has low surface tension and good wettability as well as excellent thermo-stability and oxidation resistance.

The present invention is concerned in particular with such low surface tension sulfuric acid composition adapted for use in semiconductor manufacturing processes. The present invention thus provides a low surface tension sulfuric acid composition characterized in that the sulfuric acid contains a fluorine-type surface-active agent comprising a fluoroalkylsulfonamide compound of the general formula:

$$R^1SO_2NR^2C_2H_4OA \qquad (I)$$

wherein $R^1$ stands for a fluoroalkyl group, $R^2$ for a hydrogen atom or a lower alkyl group and A for H or $SO_3H$. The present invention will now be described below in more detail.

The fluoroalkylsulfonamide compounds used in the composition of the present invention are readily available in that they are described for example in U.S. Pat. No. 2,803,656 and also commercially available. These sulfonamide compounds, not containing any metal such as sodium, potassium or calcium, exert no adverse effects on semiconductors.

The low surface tension sulfuric acid composition of the present invention has an appropriate amount of a sulfonamide compound of formula (I) above added to and dissolved in the sulfuric acid.

The amount of the above-mentioned sulfonamides of formula (I) added is in the range of 0.001–0.1%, more preferably 0.005–0.05% by weight relative to the sulfuric acid. Addition of amounts lower than the lower limit mentioned above was found to give no advantageous effects. Use of amounts higher than the upper limit mentioned above is meaningless because it produces no better effects.

The low surface tension sulfuric acid composition of the present invention has a surface tension as low as about one fourth that of conventional sulfuric acid, and a smaller contact angle relative to the silicon substrate, and can easily permeate into fine grooves of the trench structure, thereby significantly enhancing its cleaning effect. Furthermore, it is stable and retains its properties even in the form of liquid mixture with hydrogen peroxide, i.e. even when exposed to highly oxidizing condition.

Examples of the present invention will now be shown below together with comparative examples.

EXAMPLES 1–4

Surface Tension

Two different compositions were prepared by incorporating into 89% by weight sulfuric acid 0.005% and 0.01% by weight, respectively, of fluoroalkylsulfonamide (of formula (I) wherein $R^1$ stands for $C_8F_{17}$, $R^2$ for $C_3H_7$ and A for H or $SO_3H$) as fluorine-type surface-active agent, and the surface tension at 20° C. of each composition was measured by the Wilhelmy method. Measurement was also made, for comparison, for cases where no fluorine-type surface-active agent was added and where two different types (shown in Table 1 as F1 and F2) of commercially available fluorine-type surface-active agent were added. The results are shown in Table 1.

TABLE 1

| | Fluorine-type Surface-active Agent | | Surface Tension |
|---|---|---|---|
| | Type | Amount Added | (dyn/cm) |
| Example | | | |
| 1 | A = H | 0.005% | 16.4 |
| 2 | " | 0.01% | 16.1 |
| 3 | A = SO$_3$H | 0.005% | 22.1 |
| 4 | " | 0.01% | 16.5 |
| Comparative Example | | | |
| 1 | None | None | 64.0 |
| 2 | F1 | 0.01% | 45.6 |
| 3 | F2 | 0.01% | 51.2 |

F1: Perfluoroalkylbetaine
F2: Perfluoroalkylamine oxide

EXAMPLES 5–7

Stability

A test composition was prepared by mixing sulfuric acid having added thereto and dissolved therein 0.01% by weight of fluoroalkylsulfonamide (of formula (I) wherein $R^1$ is $C_8F_{17}$, $R^2$ is $C_3H_7$ and A is H) as fluorine-type surface-active agent with 30% by weight aqueous hydrogen peroxide at a ratio by volume of 4:1. The composition was kept heated at the different temperatures of 80° C., 100° C. and 130° C. Samples were taken for each temperature after 30, 60, 90 and 120 minutes and their surface tension at 25° C. was measured by the Wilhelmy method. Measurement was also made, for comparison, for cases where no fluorinetype surface-active agent was added and where two different types (shown in Table 2 as F3 and F4) of commercially available fluorine-type surface-active agent were used. The results are shown in Table 2.

TABLE 2

| | Fluorine-type Surface-active Agent | Temperature (°C.) | Change on standing of surface tension (dyn/cm) | | | | |
|---|---|---|---|---|---|---|---|
| | | | 0 min. | 30 min. | 60 min. | 90 min. | 120 min. |
| Example | | | | | | | |
| 5 | Compound (I) | 80 | 14.8 | 15.1 | 15.0 | 15.2 | 15.3 |
| 6 | Compound (I) | 100 | 15.6 | 15.4 | 15.2 | 15.5 | 14.8 |
| 7 | Compound (I) | 130 | 15.2 | 15.4 | 21.8 | 18.1 | 25.5 |
| Comparative Example | | | | | | | |
| 4 | None | 130 | 65.6 | 71.7 | 70.8 | 71.8 | 67.6 |
| 5 | F3 | 130 | 20.5 | 41.6 | 41.7 | 60.4 | 56.0 |
| 6 | F4 | 130 | 20.1 | 44.0 | 61.1 | 59.3 | 57.5 |

F3: Perfluoroalkylsulfonate
F4: Perfluoroalkylcarboxylate

As is apparent from the results obtained in Examples and Comparative Examples, the low surface tension sulfuric acid composition according to the present invention has excellent properties also in respect of resistance to heating and oxidation.

EXAMPLES 8–12

Cleaning Effect (1)

A positive-type photoresist OFPR-800 (manufactured by Tokyo Oka) was applied onto a bare silicon wafer substrate at a thickness of 1.3 μm and the wafer was subjected to pre-baking at 90° C. for 10 minutes followed by post-baking at 150° C. for 30 minutes. A test composition was prepared by mixing sulfuric acid having added thereto and dissolved therein 0.01% by weight of fluoroalkylsulfonamide (of formula (I) wherein $R^1$ is $C_8F_{17}$, $R^2$ is $C_3H_7$ and A is H) as fluorine-type surface-active agent with 30% by weight aqueous hydrogen peroxide at a ratio by volume of 4:1. This composition was used to remove the post-baking resist. The removement was performed for 5, 10 and 15 minutes at 80° C., and for 5 and 10 minutes at 100° C. After removing the resist, the silicon wafer was rinsed with water for 5 minutes, blown with $N_2$ gas, and checked for particles and haze thereon using a Surface Contamination Analyzer, Surfscan 4500 (TENCOR INSTRUMENT). Removing test was also conducted, for comparison, for cases where no fluorine-type surface-active agent was added in order to check such silicon wafers for particles and haze thereon. The results are shown in Table 3.

TABLE 3

| | Fluorine-type Surface-active Agent | Removing Condition | | Particles (≧0.24 μm) (The Number/Wafer) | Haze Area (%) |
|---|---|---|---|---|---|
| | | Liquid Temperature | Time | | |
| Example | | | | | |
| 8 | Compound [I] | 80° C. | 5 min. | 244 | 0 |
| 9 | " | 80° C. | 10 min. | 303 | 1 |
| 10 | " | 80° C. | 15 min. | 600 | 1 |
| 11 | " | 100° C. | 5 min. | 491 | 1 |
| 12 | " | 100° C. | 10 min. | 261 | 0 |
| Comparative Example | | | | | |
| 7 | None | 80° C. | 5 min. | 35805 | 36 |
| 8 | " | 80° C. | 10 min. | 34270 | 63 |
| 9 | " | 80° C. | 15 min. | 10190 | 22 |
| 10 | " | 100° C. | 5 min. | 2133 | 3 |
| 11 | " | 100° C. | 10 min. | 1837 | 7 |

EXAMPLES 13 and 14

Cleaning Effect (2)

The silicon substrate with silicon oxide film was treated under the same conditions as in Example 3 to form resist film thereon. A test composition was prepared using the same conditions as in Example 3 to remove the resist. The removement was performed at 80° C. and 100° C. for 5 minutes. After removing the resist, the silicon wafer was rinsed with water for 5 minutes, spin-dried and checked for particles and haze thereon using Surface Contamination Analyzer, Surfscan 4500 (TENCOR INSTRUMENT). Removing test was also conducted, for comparison, for cases where no fluorine-type surface-active agent was added in order to check such silicon wafers for particles and haze thereon. The results are shown in Table 4.

TABLE 4

| | Fluorine-type Surface-active Agent | Removing Condition | | Particles (≧0.24 μm) (The Number/Wafer) | Haze Area (%) |
|---|---|---|---|---|---|
| | | Liquid Temperature | Time | | |
| Example | | | | | |
| 13 | Compound [I] | 80° C. | 5 min. | 133 | 0 |
| 14 | " | 100° C. | 5 min. | 157 | 0 |
| Comparative | | | | | |

TABLE 4-continued

| | Fluorine-type Surface-active Agent | Removing Condition Liquid Temperature | Time | Particles (≧0.24 μm) (The Number/ Wafer) | Haze Area (%) |
|---|---|---|---|---|---|
| Example | | | | | |
| 12 | None | 80° C. | 5 min. | ≧14430 | 84 |
| 13 | " | 100° C. | 5 min. | 856 | 1 |

As is apparent from the results obtained in Examples and Comparative Examples, the low surface tension sulfuric acid composition according to the present invention shows an extremely high cleaning effect upon photoresist removing.

We claim:

1. A low surface tension sulfuric acid composition comprising sulfuric acid and a fluorine-type surface-active agent comprising a fluoroalkylsulfonamide compound of the general formula $$R^1SO_2NR^2C_2H_4OA \qquad (I)$$

wherein $R^1$ stands for a fluoroalkyl group, $R^2$ for a hydrogen atom or a lower alkyl group and A for H or $SO^3H$.

2. A low surface tension sulfuric acid composition as claimed in claim 1, wherein the amount of the fluoroalkylsulfonamide compound is 0.001–0.1% by weight relative to the sulfuric acid.

3. A low surface tension sulfuric acid composition as claimed in claim 1 or 2, wherein the sulfuric acid is in the form of a liquid mixture with hydrogen peroxide.

4. A low surface tension sulfuric acid composition as claimed in claim 2, wherein the amount of fluoroalkylsulfonamide compound is 0.005–0.05% by weight relative to the sulfuric acid.

5. A low surface tension sulfuric acid composition as claimed in claim 3, wherein the amount of fluoroalkylsulfonamide compound is 0.005–0.05% by weight relative to the sulfuric acid.

* * * * *

UNITED STATES PATENT AND TRADEMARK OFFICE
CERTIFICATE OF CORRECTION

PATENT NO. : 5,326,490
DATED : July 5, 1994
INVENTOR(S) : K. MORI et al.

It is certified that error appears in the above-indentified patent and that said Letters Patent is hereby corrected as shown below:

On the title page, item [54] and column 1, the title should read:
--LOW SURFACE TENSION SULFURIC ACID COMPOSITION--.

Signed and Sealed this

Twenty-eight Day of March, 1995

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,326,490
DATED : July 5, 1994
INVENTOR(S) : Kiyoto MORI et al.

It is certified that error appears in the above-indentified patent and that said Letters Patent is hereby corrected as shown below:

Title page, item [86]: change § 371 date to

--Nov. 15, 1990--; and

§ 102(e) date to --Nov. 15, 1990--.

Signed and Sealed this

Twenty-seventh Day of February, 1996

Attest:

BRUCE LEHMAN

*Attesting Officer*  *Commissioner of Patents and Trademarks*